United States Patent [19]

Tong

[11] Patent Number: 4,847,801
[45] Date of Patent: Jul. 11, 1989

[54] COMPACT GALOIS FIELD MULTIPLIER

[75] Inventor: Po Tong, Alameda, Calif.

[73] Assignee: Cyclotomics, Inc., Berkeley, Calif.

[21] Appl. No.: 112,335

[22] Filed: Oct. 26, 1987

[51] Int. Cl.$^4$ .......................... G06F 7/00; G06F 15/00
[52] U.S. Cl. .................................................. 364/746.1
[58] Field of Search .............................. 364/746.1, 754

[56] References Cited

U.S. PATENT DOCUMENTS 4,251,875  2/1981  Marver et al. ...................... 364/754
4,745,568  5/1988  Onyszchuk et al. ................ 364/754

OTHER PUBLICATIONS

Ellison et al., "Galois Logic Design", Prepared for the Air Force, Cambridge Research Lab., Air Force Systs. Commd., USAF, 1970.
Marver, "Sequential Galois Multipliers", Aug. 1977, Prepared for Office of Naval Research, Contract #W00014-77-C-0192.

Primary Examiner—Gary V. Harkcom
Assistant Examiner—Dale M. Shaw
Attorney, Agent, or Firm—Robert M. Wallace

[57] ABSTRACT

Multiplication of two mq-bit bytes (in $GF2^{mq}$) is reduced modulus an irreducible polynomial in $GF2^m$ of degree q to multiplication among two sets of q m bit bytes (in $GF2^m$) in order to simplify hardware and reduce costs, by distributing the computation among a small number of programmable read only memories (PROMs) and adders.

18 Claims, 3 Drawing Sheets $$C_0 = \boxed{a_0 b_0} + \boxed{\beta (a_1 b_2 + a_2 b_1)}$$

$$C_1 = \boxed{a_0 b_1 + a_1 b_0} + \boxed{\beta (a_1 b_2 + a_2 b_1 + a_2 b_2)}$$

$$C_2 = \boxed{a_1 b_1} + \boxed{a_0 b_2 + a_2 b_0 + \beta a_2 b_2}$$

FIG. 3

COMPACT GALOIS FIELD MULTIPLIER

BACKGROUND OF THE INVENTION

Galois field multipliers which multiply two numbers in a Galois field are used in error correction encoding and decoding hardware, such as Reed-Solomon encoders or decoders. Such encoders and decoders include many Galois field multipliers, although such multipliers necessarily include very complex hardware. Some well-known Galois field multipliers are described in Berlekamp, *Algebraic Coding Theory*, Academic Press, 1968, at pages 47-48. Using straightforward methods of implementation, the complexity and cost of such multipliers increase very rapidly with the number of bits per byte. For example, in GF512 ($GS2^9$), multiplication of any two of nine-bit bytes requires implementation of the multiplication table among the 512 elements of GF512. Assuming this is done using a pair of programmable read only memories, each programmable read only memory (PROM) would receive all nine bits of the multiplicand, one of the PROMs receiving five bits of the multiplier, and the other PROM receiving the remaining four bits of the multiplier, each PROM storing the requisite multiplication table. The output of the two PROMs is added (in an exclusion OR gate) and the result is the desired product. The complexity and cost of the two PROMs makes such an implementation too ponderous or costly for many applications and therefore unsuitable.

Problem To Be Solved

The problem is how to make a Galois field multiplier which, for large m (number of bits per byte) does not have the complexity of currently available Galois field multipliers.

SUMMARY OF THE INVENTION

Multiplication of a pair of large (mq-bit) bytes in a large Galois field $GF2^{mq}$ (e.g. of nine-bit bytes in GF512) is reduced to the simpler problem of multiplication among two sets of q small (m-bit) sub-bytes in a small Galois field $GF2^m$ (e.g. three-bit bytes in GF8) by first partitioning each mq-bit byte into q m-bit sub-bytes.

Solution to the Problem

Reduction to multiplication in the larger Galois field to the smaller Galois field requires computation of a plurality of different sub-products among the two sets of sub-bytes. It is a discovery of the invention that arranging the sub-bytes into q groups having sub-products in common, and distributing the q groups among at least q and as many as $q^2$ $GF2^m$ multipliers which produce the sub-products, minimizes the hardware. Moreover, arranging the resulting sub-products into q groups which are combined respectively in q (or more) $GF2^m$ adders produces at each of q adder outputs a respective one of the q m-bit sub-bytes of the final mq-bit product. The multiplication algorithm performed by the combination of multipliers and adders is defined by the reduction modulus an irreducible polynomial of degree q in $GF2^m$ of the product of two polynomials whose coefficients are the two sets of sub-bytes, respectively.

DESCRIPTION OF THE DRAWINGS

The invention may be understood by reference to the accompanying drawings of which:

FIG. 3 illustrates the distribution of the GF8 sub-byte computation among the multipliers PROM 0, PROM 1, PROM 2 in FIG. 2.

DETAILED DESCRIPTION OF THE INVENTION

Principle of Operation

In order to perform multiplication between two bytes each comprising a large number (mq) of bits per byte, the invention partitions the multiplicand A and the multiplier B each into q m-bit sub-bytes beginning with the least significant bit and ending with the most significant bit. The q m-bit sub-bytes into which the multiplicand A is partitioned are labeled (beginning with the least significant byte and ending with the most significant byte) $a_0, a_1, \ldots, a_{q-1}$. The q m-bit sub-bytes into which the multiplier B is partitioned are labeled in the same order $b_0, b_1, \ldots, b_{q-1}$. The q sub-bytes of A ($a_0$ through $a_{q-1}$) are multiplied by the q sub-bytes of B ($b_0$ through $b_{q-1}$) to generate $q^2$ product terms, and then simplified by reducing the multiplication operation modulus a selected polynomial F(z) of degree q which is "irreducible" (i.e., cannot be factored) in $GF2^m$. For this purpose, the mq-bit multiplicand and multiplier A and B are each viewed as polynomials in powers of Z whose coefficients are the q m-bit sub-bytes into which they were partitioned:

$$A(z) = a_{q-1}z^{q-1} + \ldots + a_1z^1 + a_0,$$

$$B(z) = b_{q-1}z^{q-1} + \ldots + b_1z^1 + b_0.$$

The multiplication operation is simplified by reducing the product A(z)B(z) modulus F(z), where F(z) is an irreducible polynomial of $GF2^m$ of degree q.

Reduction Modulus An Irreducible Polynomial F(z)

This reduction is performed by simply dividing A(z)B(z) by F(z) and discarding all of the results except for a remainder, which is itself a polynomial in z. The remainder polynomial thus obtained has q coefficients $c_0$ through $c_{q-1}$ which are m-bit bytes (i.e. elements in $GF2^m$) and comprise the q m-bit sub-bytes of the product A×B, from least significant byte to most significant byte. The least significant sub-byte, $c_0$, is the coefficient of $z^0$ in the remainder polynomial. The next least significant sub-byte, $c_1$, is the coefficient of $z^1$ in the remainder polynomial. Finally, the most significant sub-byte, $c_{q-1}$ is the coefficient of $z^{q-1}$ in the remainder polynomial.

Thus, the product C = AB is a mq-bit byte comprising the q m-bit sub-bytes $c_0, c_1, \ldots, c_{q-1}$.

The key to the invention is that the computation of the q product sub-bytes $c_0, c_1, \ldots, c_{q-1}$ involve different multiplications among common ones of the coefficients of the multiplicand A (i.e., $a_0, a_1, \ldots, a_{q-1}$) and of the multiplier B (i.e., $b_0, b_1, \ldots, b_{q-1}$). Computation of the q product sub-bytes $c_0 \ldots c_{q-1}$ is performed in at least q and as many as $q^2$ multipliers and q or more adders in such a manner as to exploit the commonality of coefficients in the overall multiplication algorithm to the fullest, thereby simplifying the hardware.

Tutorial Example

In the following tutorial example (FIG. 1), multiplication among four-bit bytes (in $GF2^4$) is carried out as multiplication of among two-bit sub-bytes in $GF2^2$.

Figure 1:
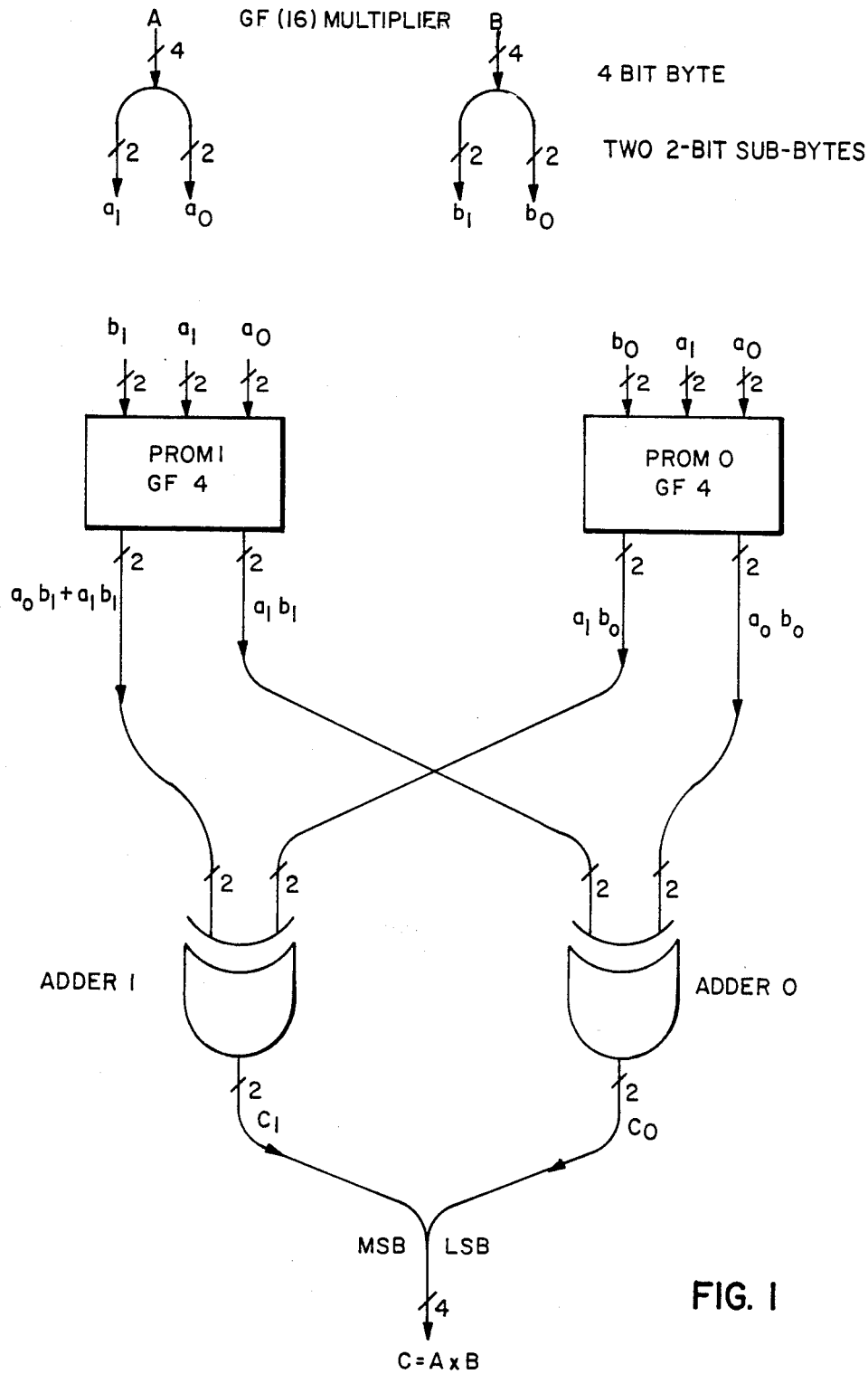
FIG. 1 is a block diagram illustrating the invention applied to a tutorial example in which multiplication in GF16 is reduced to multiplication in GF4.

Referring to FIG. 1, the invention requires use of two simple PROMs. The GF16 (i.e. four-bit byte) multiplicand A and multiplier B are each divided into a pair of two-bit sub-bytes, $a_1$, $a_0$, and $b_1$, $b_0$, respectively. In order to define the $GF2^4$ multiplication algorithm involving the four two-bit sub-bytes $a_1$, $a_0$, $b_1$, $b_0$, an irreducible polynomial of GF4 must first be chosen. In this example, the following irreducible polynomial of GF4 is chosen:

$$z^2 + z + \xi.$$

The GF4 element $\xi$ is the two-bit byte 10 of GF4. (Various other irreducible polynomials of degree 2 in GF4 are shown as factors of a polynomial on p. 107 of the above-referenced text by Berlekamp.)

Next, the product AB is expressed in a polynomial in z wherein each of the sub-bytes $a_0$, $a_1$, $b_0$, $b_1$ is a coefficient, as follows:

$$A = \sum_{i=0}^{q-1} a_i z^i = a_0 + a_1 z$$

$$B = \sum_{i=0}^{q-1} b_i z^i = b_0 + b_1 z.$$

Therefore $A \times B = a_0 b_0 + (a_0 b_1 + a_1 b_0)z + a_1 b_1 z^2$.

This latter polynomial is the product polynomial which must now be reduced modulus the irreducible polynomial of GF4 which we have chosen, namely $z^2 + z + \xi$. This is done by dividing the product polynomial, $a_0 b_0 + (a_0 b_1 + a_1 b_0)z + a_1 b_1 z^2$) by the irreducible polynomial, $z^2 + z + \xi$, and then disregarding all of the resultant polynomial quotient and keeping only the remainder polynomial. The reader is invited to perform this polynomial division long-handed and obtain $a_1 b_1$ as the quotient (which is disgarded) and the following remainder:

$(a_0 b_1 + a_1 b_0 - a_1 b_1)z + a_0 b_0 - a_1 b_1 \xi.$

In this remainder polynomial, the coefficient of $z^1$ (i.e. $a_0 b_1 + a_1 b_0 - a_1 b_1$) is the product coefficient $c_1$. The coefficient of $z^0$ (i.e. $a_0 b_0 - a_1 b_1 \xi$) is the product coefficient $c_0$. $c_1$ and $C_0$ are the two two-bit sub-bytes which, when combined together as most significant and least significant bytes, respectively, comprise the four-bit byte product $C = A \times B$ in GF16. Summarizing our results:

$c_1 = a_0 b_1 + a_1 b_0 - a_1 b_1$ $c_0 = a_0 b_0 - a_1 b_1 \xi.$

FIG. 1 shows how the products among the various coefficients ($a_0$, $a_1$, $b_0$, $b_1$) of $c_0$ and $c_1$ are computed in PROM 0 and PROM 1. PROM 0 receives the three two-bit bytes $b_0$, $a_1$, $a_0$ while PROM 1 receives the three two-bit bytes $b_1$, $a_1$, $a_0$. PROM 0 generates two outputs, namely the two-bit byte product $a_0 b_0$ and the two-bit byte product $a_1 b_0$. PROM 1 generates the following two-bit byte products: $a_0 b_1 + a_1 b_1$ and $\xi a_1 b_1$. Thus, the products are computed in two groups by the two multipliers (PROM's) from two respective sets of input coefficients common to each respective group of products. For example, PROM 1 computes the two groups of results $a_0 b_1 + a_1 b_1$ and $\xi a_1 b_1$ from the group of three coefficients $b_1$, $a_1$, $a_0$ which are common to the three products.

Adder 0 computes the product coefficient $c_0$ (the least significant two-bit byte of the product) by adding together two of the products from PROM 0 and PROM 1, $a_0 b_0 + \xi a_1 b_1$, respectively. Adder 1 computes the product coefficient $c_1$ by adding together the products from PROM 0 (i.e. $a_1 b_0$) and PROM 1 (i.e. $a_0 b_1 + a_1 b_1$). FIG. 1 illustrates that when $c_1$ and $c_0$ are combined together as the most significant sub-byte and the least significant sub-byte respectively, the result is the four-bit byte $C = A \times B$ in GF16.

The reduction of multiplication in GF16 to multiplication in GF4, while affording some reduction in hardware complexity and cost, does not afford the most dramatic reduction. Accordingly, the main advantage of the example of FIG. 1 is its tutorial clarity, and is not necessarily the preferred embodiment of the invention.

Working Example

A very dramatic reduction in hardware complexity and cost is achieved when the invention is applied to the problem of multiplying together two large bytes in GF512 (i.e. $GF2^9$) in which all bytes are nine-bit bytes. As mentioned previously, using two PROMs, each of which receives all bytes of the multiplier and respective sub-bytes of the multiplicand, would be too costly and complex.

Figure 2:
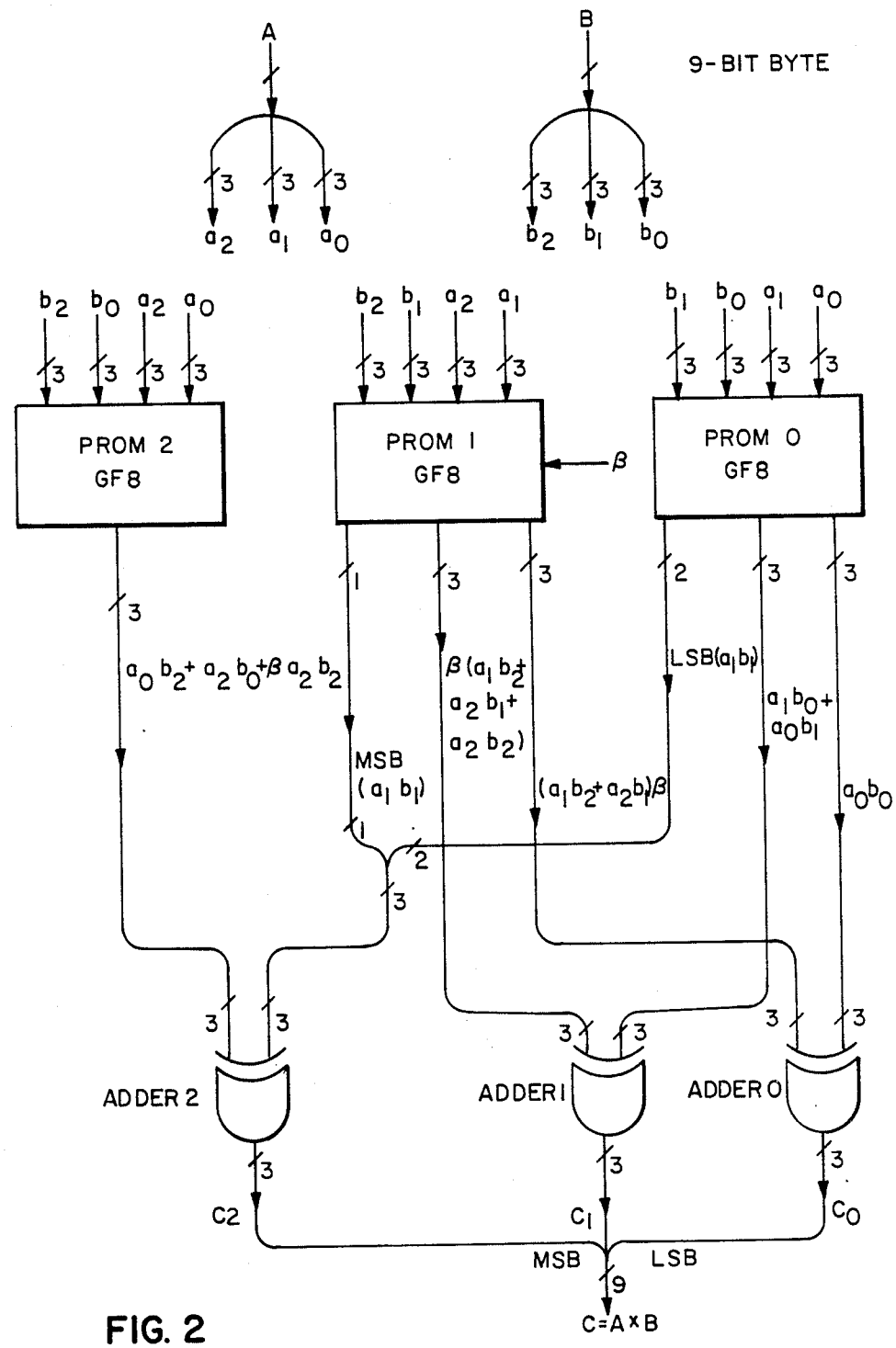
FIG. 2 illustrates the invention in a practical example in which multiplication in a very large field (GF512) is reduced to multiplication in a simpler field (GF8)

In the embodiment of FIG. 2, multiplication in GF512 is reduced to multiplication in GF8. The two nine-bit bytes to be multiplied together are each partitioned into three three-bit sub-bytes before multiplication is carried out.

First, an irreducible polynomial of GF8 must be chosen. In this example, the preferred irreducible polynomial of GF8 is:

$F(z) = \beta + \beta z + z^3,$ where $\beta$ is the following three-bit byte element of GF8: 111. In this example, $q = 3$ (the ratio of the number of bits in GF512 and GF8) and so the degree of F(z) must be 3. There are a number of irreducible polynomials of degree 3 in GF8. However, this particular choice of F(z) was made because it has the least number of non-zero coefficients.

Next, we must compute the product polynomial of $A \times B$, where:

$A(z) = a_2 z^2 + a_1 z^1 + a_0$ and $B(z) = b_2 z^2 + b_1 z^1 + b_0.$

Multiplying A(z) by B(z), $A(z)B(z) = a_0 b_0 + (a_0 b_1 + a_1 b_0)z + (a_0 b_2 + a_1 b_1 + a_2 b_0)z^2 + (a_1 b_2 + a_2 b_1)z^3 + a_2 b_2 z^4.$ Dividing this polynomial product by the chosen primitive polynomial F(z) (namely $\beta + \beta z + z^3$) and disgarding all but the residual remainder polynomial left over from the polynomial division operation, the following result is obtained:

$$A(z)B(z) \bmod F(z) = c_0 + c_1 z + c_2 z^2,$$

where $$c_0 = a_0 b_0 + \beta(a_1 b_2 + a_2 b_1) \tag{1}$$

$$c_1 = a_0 b_1 + a_1 b_0 + \beta(a_1 b_2 + a_2 b_1 + a_2 b_2) \tag{2}$$

$$c_2 = a_0 b_2 + a_1 b_1 + a_2 b_0 + \beta a_2 b_2. \tag{3}$$

The product $A(z)B(z) \bmod F(z)$ is the desired result of the multiplication in GF512 reduced to GF8. $c_0$ is the least significant three-bit sub-byte of the 9-bit product $C=AB$. $c_1$ is the next significant three-bit sub-byte. $c_2$ is the most significant three-bit sub-byte in the 9-bit product byte $C=AB$. Thus, the three three-bit sub-bytes or coefficients $c_0$, $c_1$, $c_2$ together comprise the nine-bit byte product $C=AB$ in GF512. Each of the coefficients $c_0$, $c_1$, $c_2$ is computed from the coefficients (or sub-bytes) $a_0$, $a_1$, $a_2$, $b_0$, $b_1$, $b_2$ in accordance with the foregoing definitions of $c_0$, $c_1$, $c_2$ (equations (1), (2) and (3)).

FIG. 2 shows just how this is done in accordance with the invention with a minimum complexity of hardware. In FIG. 2, the nine bits of the multiplicand A is partitioned into three three-bit sub-bytes, namely $a_0$, $a_1$, $a_2$, and the nine bits of the multiplier B are partitioned into three three-bit sub-bytes, namely $b_0$, $b_1$ and $b_2$, from the least significant bit to the most significant bit respectively. Inspecting the definitions above (equations (1)–(3)) for the coefficients $c_0$, $c_1$ and $c_2$ (see FIG. 3), it is readily apparent that there are q (i.e. 3) groups of the required sub-products (e.g. $a_2 b_1 + b_1 a_2$ being one of the sub-products) having various ones of the coefficients $a_1$, $a_2$, $a_3$, $b_1$, $b_2$, $b_3$ in common. Relegating to each multiplier or PROM the computation of one of the groups of sub-products greatly simplifies the hardware implementation. The greatest simplification is achieved in FIG. 2 using three programmable read only memories (PROM's) namely PROM 0, PROM 1 and PROM 2. PROM 0 receives the following three-bit bytes: $a_0$, $a_1$, $b_0$, $b_1$, beginning with the least significant byte and ending with the most significant byte, respectively. PROM 1 receives the following three-bit bytes: $a_1$, $a_2$, $b_1$, $b_2$, beginning with the least significant byte and ending with the most significant byte, respectively. PROM 2 receives the following three-bit bytes: $a_0$, $a_2$, $b_0$, $b_2$, beginning with the least significant byte and ending with the most significant byte, respectively. Each of the PROM's (namely PROM 0, PROM 1, PROM 2) is programmed with the GF8 multiplication table which is as follows:

TABLE I

Multiplication Table for GF (8)

| | 0 | 1 | 2 | 3 | 4 | 5 | 6 | 7 |
|---|---|---|---|---|---|---|---|---|
| 0 | 0 | 0 | 0 | 0 | 0 | 0 | 0 | 0 |
| 1 | 0 | 1 | 2 | 3 | 4 | 5 | 6 | 7 |
| 2 | 0 | 2 | 4 | 6 | 3 | 1 | 7 | 5 |
| 3 | 0 | 3 | 6 | 5 | 7 | 4 | 1 | 2 |
| 4 | 0 | 4 | 3 | 7 | 6 | 2 | 5 | 1 |
| 5 | 0 | 5 | 1 | 4 | 2 | 7 | 3 | 6 |
| 6 | 0 | 6 | 7 | 1 | 5 | 3 | 2 | 4 |
| 7 | 0 | 7 | 5 | 2 | 1 | 6 | 4 | 3 |

Using the foregoing multiplication table, PROM 0 computes the following three-bit byte sub-products in GF(8) from the four three-bit byte inputs it receives: $a_0 b_0$; $a_1 b_0 + a_0 b_1$; and, the two least significant bits of $a_1 b_1$. PROM 1 computes the following three-bit byte sub-products from various ones of its four three-bit byte inputs: $a_1 b_2 + a_2 b_1$ (which PROM 1 multiplies by $\beta$, $\beta$ being the three-bit byte 111); $a_1 b_2 + a_2 b_1 + a_2 b_2$ (which PROM 1 multiplies by $\beta$); and, the most significant bit of the three-bit byte product $a_1 b_1$. PROM 2 computes the following three-bit byte sub-product from its four three-bit byte inputs: $a_0 b_2 + a_2 b_0 + \beta a_2 b_2$.

This distribution of the three groups of sub-products among the three PROMs is illustrated in FIG. 3 in accordance with the definition of the coefficients (sub-bytes) $c_0$, $c_1$, $c_2$ of equations (1)–(3). The three groups of sub-products are outlined in dashed line in FIG. 3, each group sharing its own unique set of four of the coefficients (sub-bytes) $a_0$, $a_1$, $a_2$, $b_0$, $b_1$, $b_2$.

Various ones of the products computed by the three PROMs (PROM 0, PROM 1, PROM 2) are combined in various ones of three adders (namely adder 0, adder 1, adder 2) in accordance with the definitions of FIG. 3. The three adders each take the form of three-bit exclusive OR gates (six bit input, three bit output) in accordance with well-known techniques for adding plural Galois field elements together to form a Galois field sum.

Adder 0 combines the product $a_0 b_0$ (from PROM 0) with the product $\beta(a_1 b_2 + a_2 b_1)$ (from PROM 1), the resulting sum being $c_0$. Adder 1 combines the three-bit byte product $a_1 b_0 + a_0 b_1$ (from one PROM 0) with the three-bit byte product $\beta(a_1 b_2 + a_2 b_1 + a_2 b_2)$ (from PROM 1), the resulting three-bit byte sum being the coefficient $c_1$. The least significant two bits of the three-bit byte product $a_1 b_1$ (from PROM 0) are combined with the most significant bit of $a_1 b_1$ (from PROM 1)—thus forming all three bits of the three-bit byte product $a_1 b_1$—and the resulting three-bit byte is applied to one input of adder 2. Adder 2 combines this product with the product $a_0 b_2 + a_2 b_0 + \beta a_2 b_2$ (from PROM 2) and the resulting sum is the coefficient $c_2$.

Conclusion

In general, a multiplication in an mq bit-per-byte field may be reduced to multiplications in an m-bit-per-byte field. The different multiplications of the m-bit sub-bytes are partitioned into q multiplication groups each having about q+1 or so sub-bytes in common, each of the q multiplication groups being assigned to one of at least q and as many as $q^2$ m-bit multipliers. The outputs of the multipliers are variously combined in at least q adders.

Such partitioning is used to simplify the hardware complexity in the embodiment of FIG. 1 as well as in FIG. 2. Of course, the partitioning is dependent upon the choice of the irreducible polynomial F(z), and also is different for different values of q and m. In this description, two examples are given, namely reduction of multiplication in GF16 to GF4 (q=4, m=4) and reduction of multiplication in GF512 to GF8 (q=3, m=3). Various other embodiments are realized where multiplication occurs in a large Galois field (such as GF256, GF1024, etc.).

Accordingly, while the invention has been described in detail with reference to preferred embodiments thereof, modifications and variations thereof may be made without departing from the spirit and scope of the invention.

What is claimed is:

1. A Galois field multiplier wherein mq-bit multiplier and multiplicand bytes are each partitioned into a plurality of q m-bit sub-bytes, q and m each being integers greater than zero, and wherein multiplication among selected groups of said multiplier and multiplicand sub-bytes is distributed among a plurality of m-bit multipliers which each compute m-bit intermediate product sub-bytes therefrom, and wherein computation of an mq-bit product is partitioned into computation of q m-bit final product sub-bytes by q respective adders from respective q sets of said m-bit intermediate product sub-bytes.

2. The multiplier of claim 1 wherein said respective q sets of said m-bit intermediate product sub-bytes are selected in accordance with reduction of the product of said mq-bit multiplier and multiplicand bytes into an m-bit field.

3. The multiplier of claim 2 wherein said reduction is modulus an irreducible polynomial of degree q in Galois field $GF2^m$.

4. The multiplier of claim 1 wherein said plurality of m-bit multipliers comprises a plurality of programmable read only memories each containing the multiplication table of Galois field $GF2^m$.

5. The multiplier of claim 3 wherein at least one of said m-bit multipliers multiplies at least one of said m-bit intermediate product sub-bytes by at least one of the coefficients of said irreducible polynomial.

6. A Galois field $GF2^{mq}$ multiplier which multiplies mq-bit multiplier and multiplicand bytes A and B together to produce an mq-bit product byte C, said product byte C comprising a plurality of q m-bit product sub-bytes $c_0$ and $c_{1-1}$, said multiplier comprising:
means for partitioning each of said mq-bit multiplier and multiplicand bytes A and B into a plurality of q m-bit multiplier and multiplicand sub-bytes $a_0$ through $a_{q-1}$ and $b_0$ through $b_{q-1}$, respectively;
a plurality of multiplier means programmed in accordance with a Galois field $GF2^m$ multiplication table and receiving respective q groups of said multiplier and multiplicand sub-bytes and to compute therefrom respective q sets of sub-products $a_ib_j$;
a plurality of adder means, each of said adder means receiving a respective plurality of sub-products selected from among said q sets of sub-products $a_ib_j$, and to compute, from said respective plurality, one of said q product sub-bytes $c_i$, whereby said adder means computes said q product sub-bytes $c_0$ through $c_{q-1}$ of said product C.

7. The multiplier of claim 6 wherein said q product sub-bytes $c_0$ through $c_{q-1}$ are coefficients of $$\sum_{i=1}^{q-1} a_i z^i \sum_{j=0}^{q-1} b_j z^j$$

reduced modulus an irreducible polynomial $GF2^m$, i and j being positive integers, said irreducible polynomial being of degree q.

8. The multiplier of claim 6 wherein each of said plurality of multiplier means comprises a programmable read only memory.

9. The multiplier of claim 7 wherein at least one of said plurality of multiplier means multiplies at least one of said sub-products $a_ib_j$ by at least one of the coefficients of said irreducible polynomial.

10. A $GF2^{mq}$ multiplier which multiplies two mq-bit bytes A and B together to produce an mq-bit byte product C, m and q each being integers greater than zero, said multiplier comprising:
means for partitioning each of said mq-bit bytes A and B into q m-bit sub-bytes, wherein A is partitioned into the set of q sub-bytes $a_i$ and B is partitioned into the set of q sub-bytes $b_i$ where i is an integer and ranges from 1 to $q-1$;
a plurality of multiplier means programmed in accordance with $GF2^m$ multiplication table;
means for distributing q groups of said sub-bytes $a_i$ and $b_i$ to corresponding ones of said multiplier means, each of said multiplier means computing m-bit byte sub-products comprising combinations of the m-bit sub-bytes within the corresponding group;
a plurality of Galois field adder means, each of said adder means receiving at least two of said m-bit byte sub-products, each of said adder means computing a sum equal to a corresponding one of said q product sub-bytes $c_i$, so that said plurality of adder means together compute all of the q product sub-bytes $c_i$ comprising the mq-bit byte product C.

11. The multiplier of claim 10 wherein said products are coefficients of a polynomial $$\sum_{i=0}^{q-1} a_i z^i \sum_{j=0}^{q-1} b_j z^j$$

reduced modulus an irreducible polynomial of degree q in $GF2^m$.

12. The multiplier of claim 10 wherein each of said multipliers comprises a programmable read only memory containing micro coded instructions representative of the multiplication table of $GF2^m$.

13. The multiplier of claim 3, wherein m=3, q=3 and said irreducible polynomial is $\beta+\beta z+z^3$, where $\beta$ is the GF8 element (111).

14. The multiplier of claim 7, wherein m=3, q=3 and said irreducible polynomial is $\beta+\beta z+z^3$, where $\beta$ is the GF8 element (111).

15. The multiplier of claim 11, wherein m=3, q=3 and said irreducible polynomial is $\beta+\beta z+z^3$, where $\beta$ is the GF8 element (111).

16. The multiplier of claim 3, wherein m=2, q=2 and said irreducible polynomial is $z^2+z+\xi$, where $\xi$ is the GF4 element (10).

17. The multiplier of claim 7, wherein m=2, q=2 and said irreducible polynomial is $z^2+z+\xi$, where $\xi$ is the GF4 element (10).

18. The multiplier of claim 11, wherein m=2, q=2 and said irreducible polynomial is $z^2+z+\xi$, where $\xi$ is the GF4 element (10).

* * * * *